(12) United States Patent
Kato

(10) Patent No.: US 6,424,236 B1
(45) Date of Patent: Jul. 23, 2002

(54) STACKED LC FILTER WITH A POLE-ADJUSTING ELECTRODE FACING RESONATOR COUPLING PATTERNS

(75) Inventor: Noboru Kato, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/566,568

(22) Filed: May 8, 2000

(30) Foreign Application Priority Data

May 7, 1999 (JP) .......................................... 11-127820

(51) Int. Cl.[7] ................................................ H03H 7/01
(52) U.S. Cl. ........................................ 333/185; 333/184
(58) Field of Search ................................. 333/184, 185, 333/204

(56) References Cited

U.S. PATENT DOCUMENTS 5,140,497 A * 8/1992 Kato et al. .............. 333/202 X

* cited by examiner

*Primary Examiner*—Justin P. Bettendorf
(74) *Attorney, Agent, or Firm*—Keating & Bennett, LLP

(57) ABSTRACT

A stacked LC filter includes a layered body defined by a plurality of insulating layers, a plurality of inductor patterns, and a plurality of capacitor patterns in a stacked arrangement At least three LC resonators are disposed in the layered body including a plurality of inductors, which are defined by the inductor patterns, and a plurality of capacitors, which are defined by the capacitor patterns disposed so as to face the inductor patterns. At least two coupling capacitor patterns are stacked in the layered body and are arranged to couple the LC resonators. A pole adjusting pattern is stacked in the layered body and faces the at least two coupling capacitor patterns.

18 Claims, 7 Drawing Sheets

PRIOR ART

PRIOR ART

STACKED LC FILTER WITH A POLE-ADJUSTING ELECTRODE FACING RESONATOR COUPLING PATTERNS

BACKGROUND OF THE INVENTION

1. Field of the Invention

The present invention relates to LC filters, and more particularly, relates to a stacked LC filter for use at high frequencies.

2. Description of the Related Art

FIG. 8 shows a three or more stage band-pass filter allowing a signal in a particular frequency band to pass through it. The band-pass filter is a three-stage band-pass filter having a first stage resonator Q1, a second stage resonator Q2 and a third stage resonator Q3. These LC resonators Q1 to Q3 are electrically coupled via coupling capacitors Cs1 and Cs2 between adjacent resonators.

FIGS. 9 to 11 show a stacked band-pass filter having the above-described known circuit construction. An LC filter 1 having the first stage to the third stage LC resonators Q1 to Q3 are disposed in a layered body 21 constructed by stacking quadrangular ceramic sheets 2. The LC filter shown in FIGS. 9 to 11 is equivalent to the circuit shown in FIG. 8.

Inductors L1 to L3 of the LC resonators Q1 to Q3 include inductor patterns 3, 4, and 5, respectively. Capacitors C1 to C3 of the LC resonators Q1 to Q3 include capacitor patterns 9, 10, and 11, and edge portions 6, 7, and 8 of the inductor patterns 3, 4, and 5 which face the capacitor patterns 9, 10, and 11, respectively. The above LC resonators Q1 to Q3 are electrically coupled via the coupling capacitors Cs1 and Cs2 which include the capacitor patterns 9 to 11 and coupling capacitor patterns 12 and 13 which face these capacitor patterns 9 to 11. These LC resonators Q1 and Q3 are capacitively-coupled with an input capacitor pattern 14 and an output capacitor pattern 15, respectively. Shielding patterns 16a and 16b are provided such that the inductor patterns 3 to 5 and capacitor patterns 9 to 15 are held therebetween.

The layered body 21 has an input terminal electrode 26, an output terminal electrode 27, and shielding electrodes 28 and 29 disposed as shown in FIG. 10. The input terminal electrode 26 is connected to the input capacitor pattern 14, and the output terminal electrode 27 is connected to the output capacitor pattern 15. The shielding terminal electrode 28 is connected to the lead portions of the inductor patterns 3, 4, and 5 as well as to edge portions of shielding patterns 16a and 16b. The shielding terminal electrode 29 is connected to the lead portions of the capacitor patterns 9 to 11 as well as the other edge portions of the shielding patterns 16a and 16b.

In the conventional LC filter 1, positions of poles (singular points) in attenuation characteristics cannot be easily adjusted. To change the positions of the poles, the shapes of the inductor patterns 3 to 5, the shapes of the capacitor patterns 9 to 11, and the shapes of the coupling capacitor patterns 12 and 13 must be adjusted. Therefore, almost all patterns have to be redesigned.

SUMMARY OF THE INVENTION

In order to overcome the problems described above, preferred embodiments of the present invention provide a stacked LC filter in which the positions of poles in attenuation characteristics can be easily adjusted A stacked LC filter of a preferred embodiment of the present invention includes a layered body including a plurality of insulating layers, a plurality of inductor patterns, and a plurality of capacitor patterns stacked on each other, at least three LC resonators disposed in the layered body having a plurality of inductors defined by the inductor patterns, and a plurality of capacitors defined by the capacitor patterns which face the inductor patterns, at least two coupling capacitor patterns, stacked in the layered body arranged to coupled the LC resonators to one another, and a pole adjusting pattern stacked in the layered body, facing the at least two coupling capacitor patterns.

The arrangement of the pole adjusting pattern facing at least two coupling capacitor patterns allows the positions of poles in attenuation characteristics to be easily adjusted. For example, when the area of the overlapping portion between the coupling capacitor patterns and the pole adjusting pattern is increased, an electrostatic capacitance generated between the pole adjusting pattern and the coupling capacitor patterns is increased, which thereby increases the spacing between poles. Conversely, when the area of the overlapping portion is decreased, the spacing between poles is decreased. Therefore, the stacked LC filter of preferred embodiments of the present invention has superior attenuation characteristics, and consequently a superior duplexer can be produced using this stacked LC filter.

In the stacked LC filter, each inductor of each LC resonator has a multi-layered structure defined by at least two stacked inductor patterns having a substantially identical shape, with the insulating layers provided therebetween.

The multi-layered inductor arrangement prevents increased magnetic fields from being generated at the edge portions of inductor patterns. As a result, the Q-factor is greatly improved.

Other features, elements, characteristics and advantages of the present invention will become apparent from the detailed description of preferred embodiments thereof with reference to the drawings attached hereto.

DETAILED DESCRIPTION OF PREFERRED EMBODIMENTS

Stacked LC filters according to preferred embodiments of the present invention are described with reference to the attached drawings. Although the stacked LC filters are described in the context of a band-pass filter, the stacked LC filter is also suitable for a band-elimination (band-rejection) filter or other suitable filters.

Figure 1:
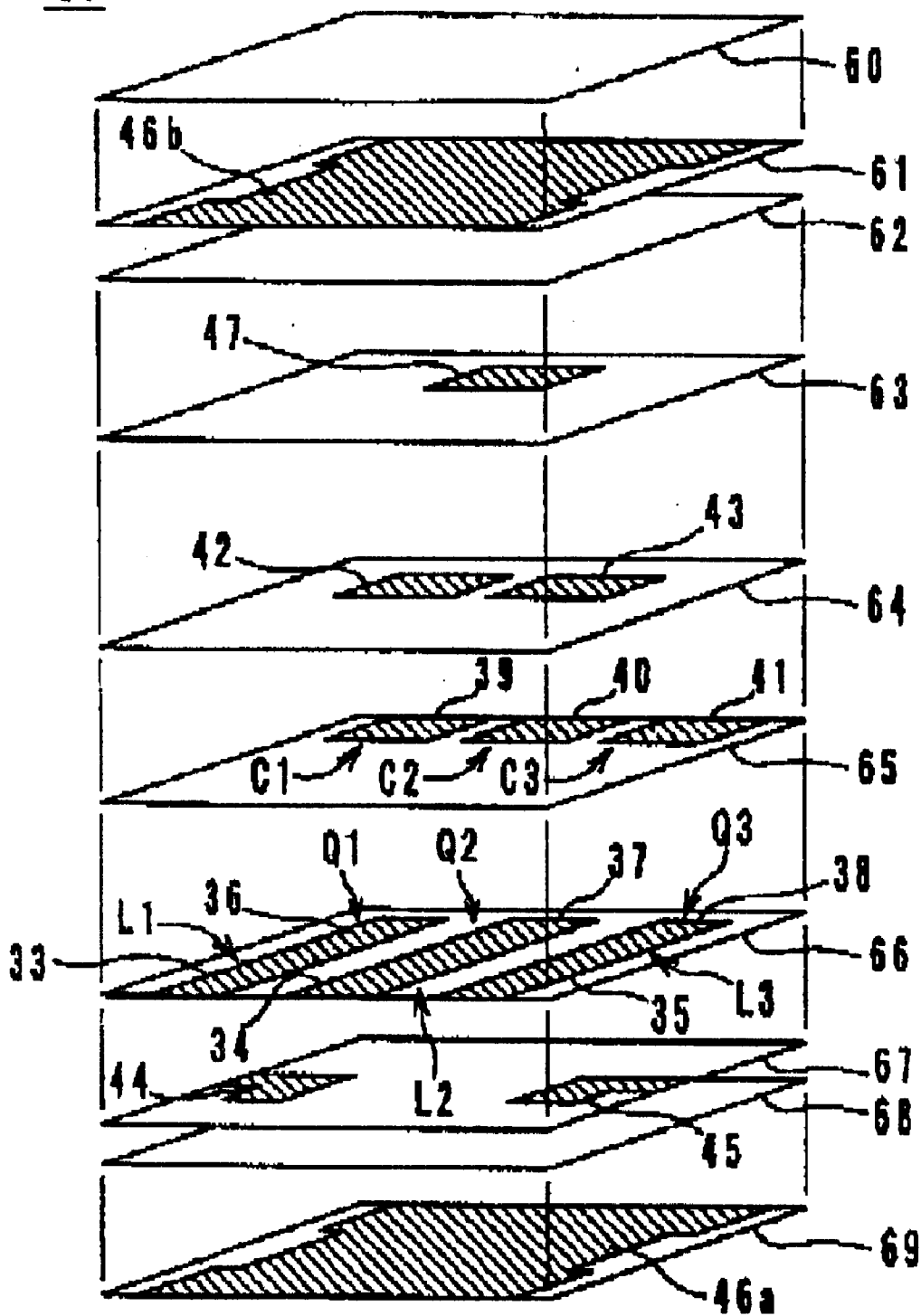
FIG. 1 is an exploded perspective view showing the construction of a stacked LC filter according to a first preferred embodiment of the present invention.
Figure 2:
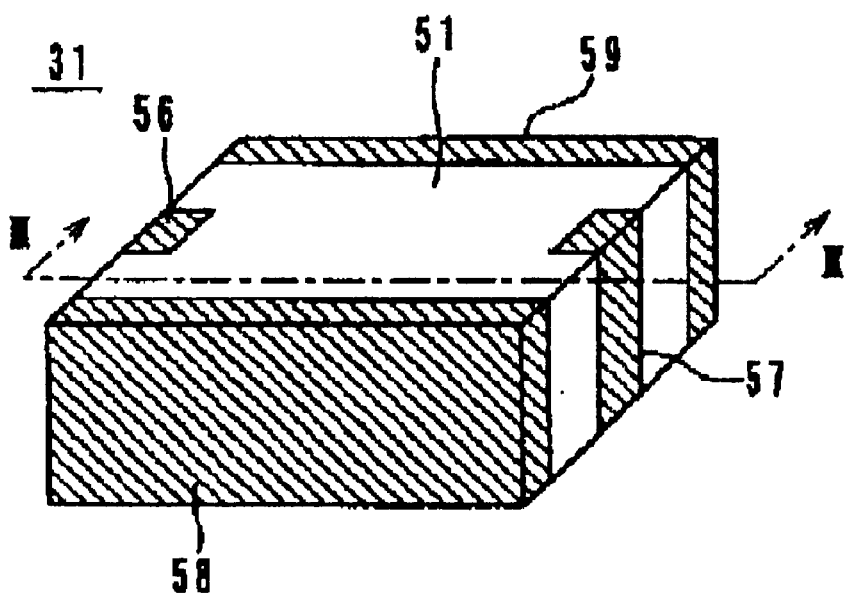
FIG. 2 is an outer perspective view showing the stacked LC filter shown in FIG. 1.
Figure 3:
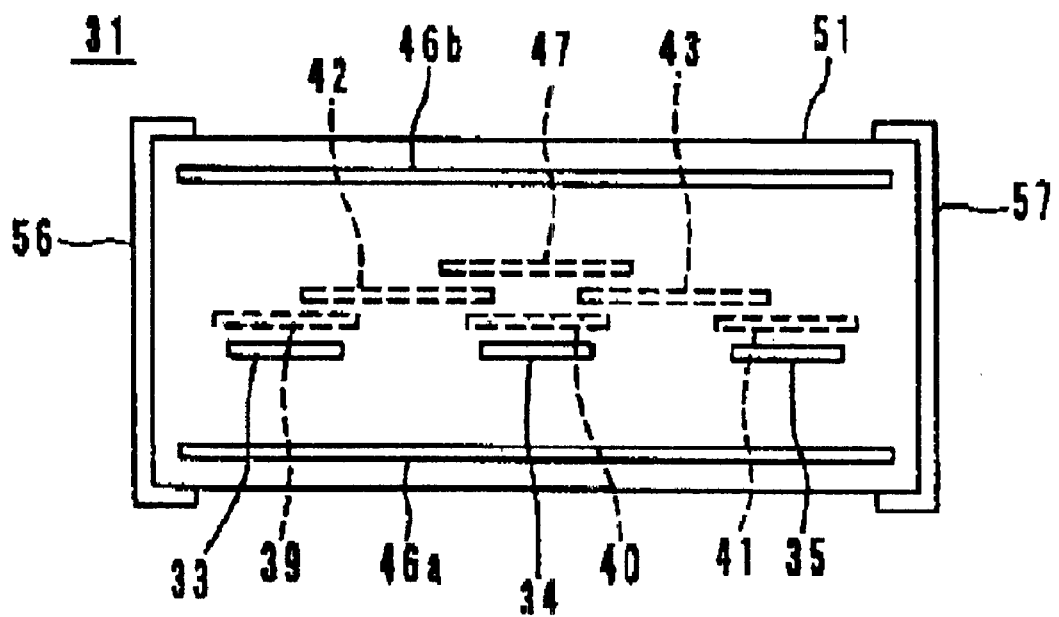
FIG. 3 is a cross-sectional diagram of the LC filter in FIG. 2 through a line III—III.
Figure 8:
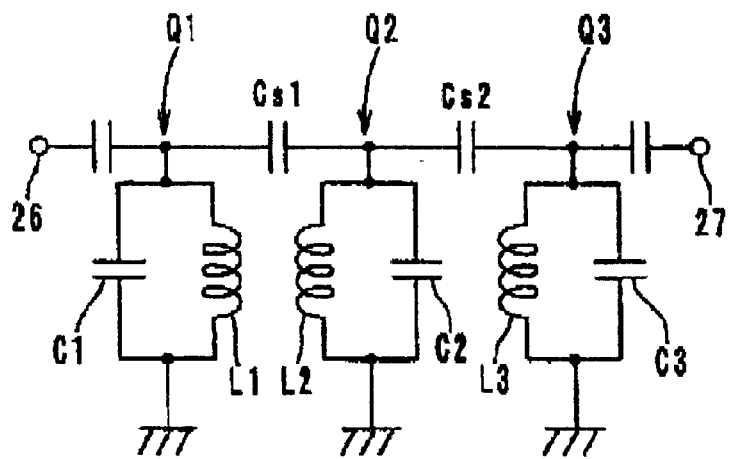
FIG. 8 is a diagram showing an equivalent circuit of a stacked LC filter.
Figure 9:
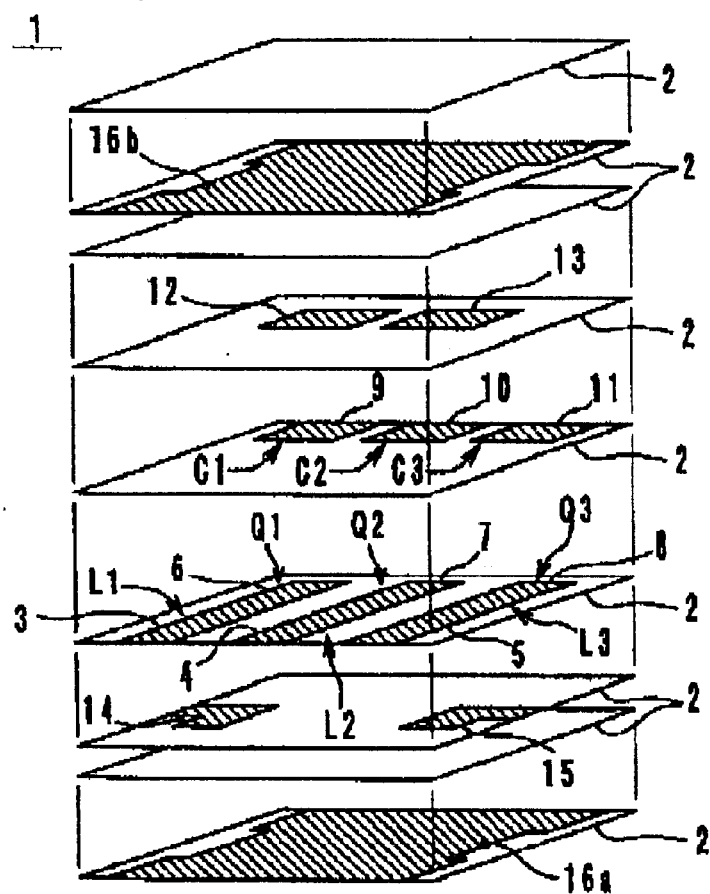
FIG. 9 is an exploded perspective view showing the construction of a conventional stacked LC filter.
Figure 10:
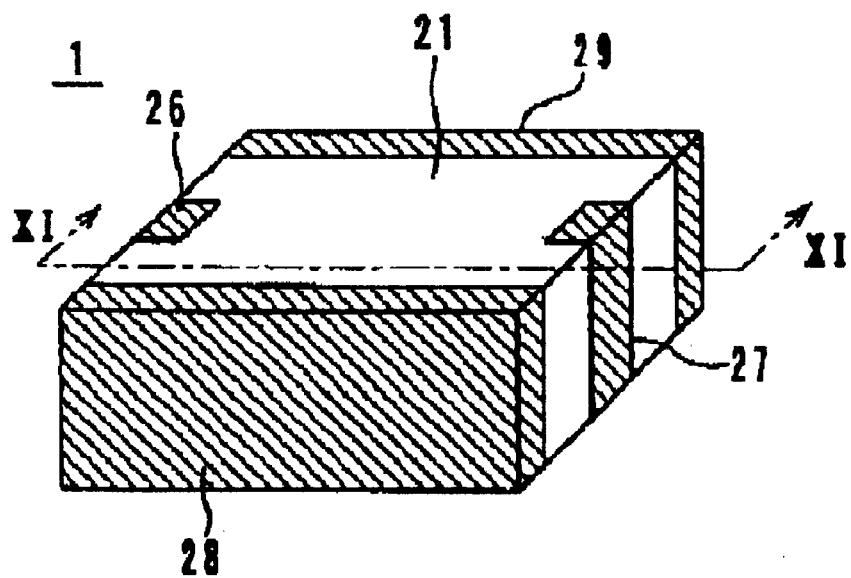
FIG. 10 is an outer perspective view showing the stacked LC filter shown in FIG. 9.
Figure 11:
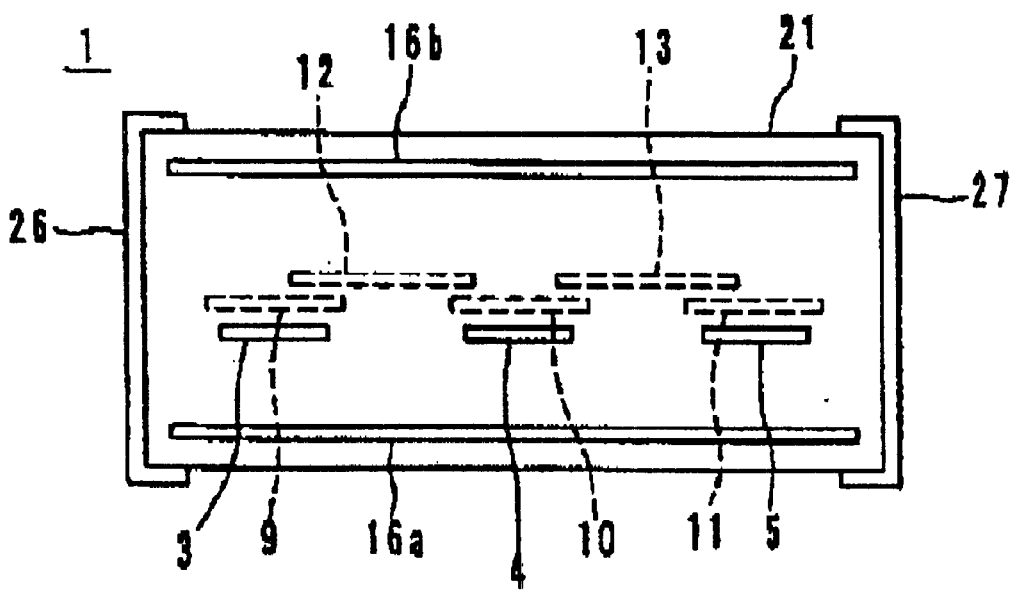
FIG. 11 is a cross-sectional diagram of the LC filter in FIG. 10 through a line XI—XI.

A first preferred embodiment of the LC filter according to the present invention is shown in FIGS. 1 to 3. FIG. 8 shows an LC filter 31 having a first stage to a third stage LC resonators Q1 to Q3. The LC filter 31 according to a first preferred embodiment of the present invention includes first stage to third stage LC resonators Q1 to Q3 in a layered body 51 constructed of stacked and uniformly sintered substantially rectangular ceramic sheets 60 to 69 made of barium titanate and other suitable materials.

An inductor L1 of the first stage (the initial stage) LC resonator Q1, as shown in FIG. 1, is defined by a strip inductor pattern 33. The capacitor C1 of the LC resonator Q1 is defined by a capacitor pattern 39 and an edge portion 36 of the inductor pattern 33 facing the capacitor pattern 39.

An inductor L2 of the second stage LC resonator Q2 is defined by a strip inductor pattern 34. A capacitor C2 of the LC resonator Q2 is defined by a capacitor pattern 40 and an edge portion 37 of the inductor pattern 34 facing the capacitor pattern 40.

An inductor L3 of the third stage LC resonator Q3 is defined by a strip inductor pattern 35. A capacitor C3 of the LC resonator Q3 is defined by a capacitor pattern 41 and an edge portion 38 of the inductor pattern 35 facing the capacitor pattern 41.

In the above first stage to third stage LC resonators Q1 to Q3, the adjacent LC resonators Q1 and Q2, and the adjacent LC resonators Q2 and Q3 are electrically coupled, respectively, via coupling capacitors Cs1 and Cs2 defined by the capacitor patterns 39 to 41 and coupling capacitor patterns 42 and 43 which face these capacitor patterns 39 to 41 via the sheet 64.

A pole adjusting pattern 47 facing the coupling capacitor patterns 42 and 43 generates electrostatic capacitance between the pole adjusting pattern 47 and the capacitor patterns 42 and 43. Furthermore, the LC resonators Q1 and Q3 are capacitively-coupled with an input capacitor pattern 44 and an output capacitor pattern 45, respectively.

The inductor patterns 33, 34, and 35, which are disposed in the left portion of, in the middle portion of, and in the right portion of the sheet 66, respectively, have edge portions thereof exposed at the front edge portion of the sheet 66. The capacitor patterns 39, 40, and 4, which are disposed in the left portion of, in the middle portion of, and in the right portion of the sheet 65, respectively, have edge portions thereof exposed at the rear edge portion of the sheet 65. The coupling capacitor patterns 42 and 43 are disposed in the vicinity of the rear edge portion of the sheet 64. The pole adjusting pattern 47 is disposed in the vicinity of the rear edge portion of the sheet 63. Shielding patterns 46a and 46b are provided such that the above patterns 33 to 35, 39 to 45, and 47 are disposed therebetween.

As shown in FIG. 2, the layered body 51 includes an input terminal electrode 56, an output terminal electrode 57, and shielding terminal electrodes 58 and 59. The input terminal electrode 56 is connected to the input capacitor pattern 44, and the output terminal electrode 57 is connected to the output capacitor pattern 45. The shielding terminal electrode 58 is connected to the lead portions of the inductor patterns 33, 34, and 35 as well as to one edge portion of each of the shielding patterns 46a and 46b. The shielding terminal electrode 59 is connected to the lead portions of the capacitor patterns 39 to 41 as well as to the other edge portion of each of the shielding patterns 46a and 46b.

Figure 4:
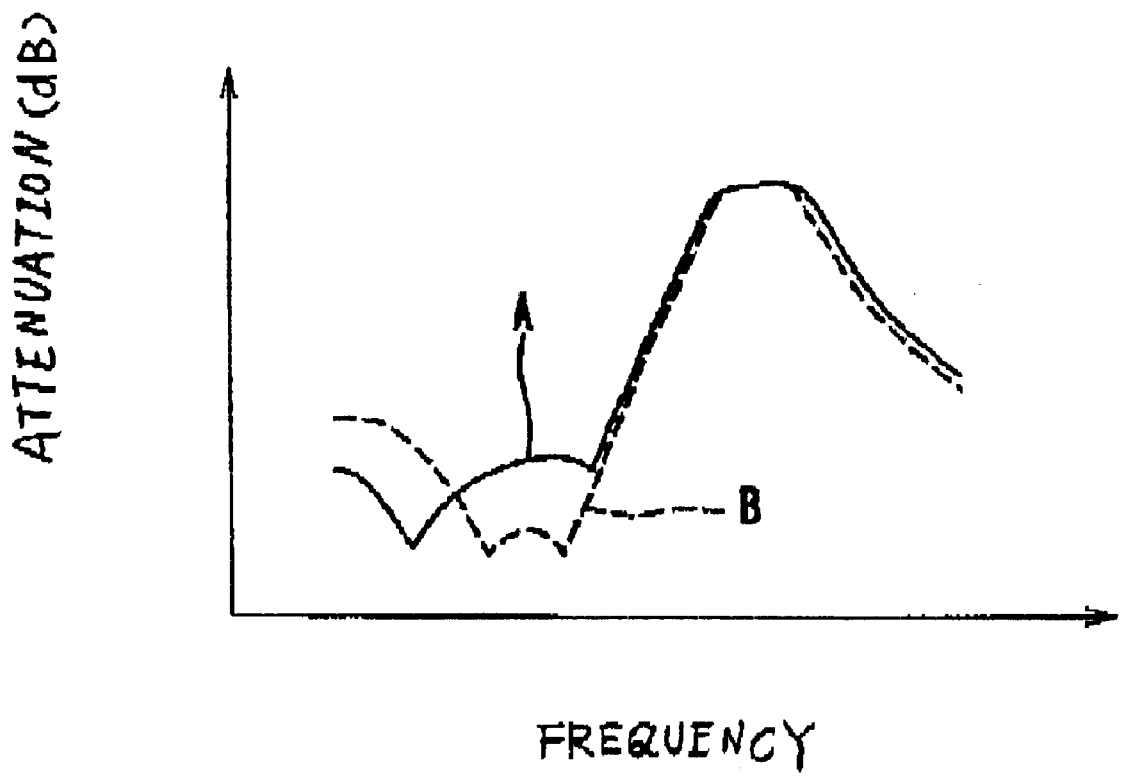
FIG. 4 is a graph showing attenuation characteristics of the stacked LC filter shown in FIG. 2.

In the LC filter 31 having the above construction, the spacing between poles can be adjusted by varying the area of the overlapping portion between the pole adjusting pattern 47 and the coupling capacitor patterns 42 and 43. For example, when the portion of the overlapping area is increased, the capacitance provided by the pole adjusting pattern 47 and the coupling capacitor patterns 42 and 43 increases, which, as shown by the solid line A in FIG. 4, produces attenuation characteristics having a larger pole spacing. Conversely, when the portion of the overlapping area is decreased, as shown with the broken line B, attenuation characteristics having a reduced pole spacing are produced. Therefore, the LC filter 31 greatly simplifies adjustment of the positions of poles in the attenuation characteristics.

Figure 5:
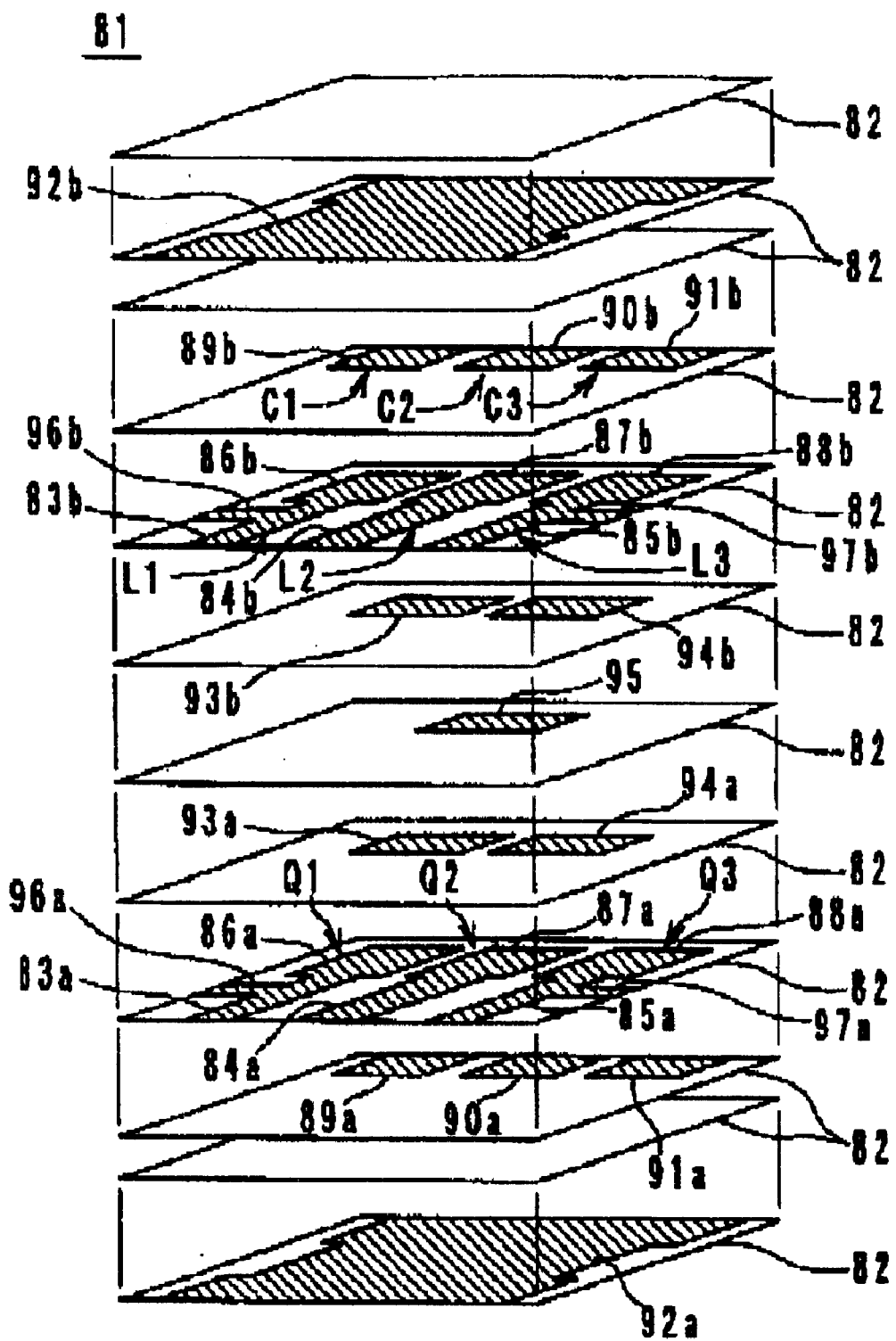
FIG. 5 is an exploded perspective view showing the construction of a stacked LC filter according to a second preferred embodiment of the present invention.
Figure 6:
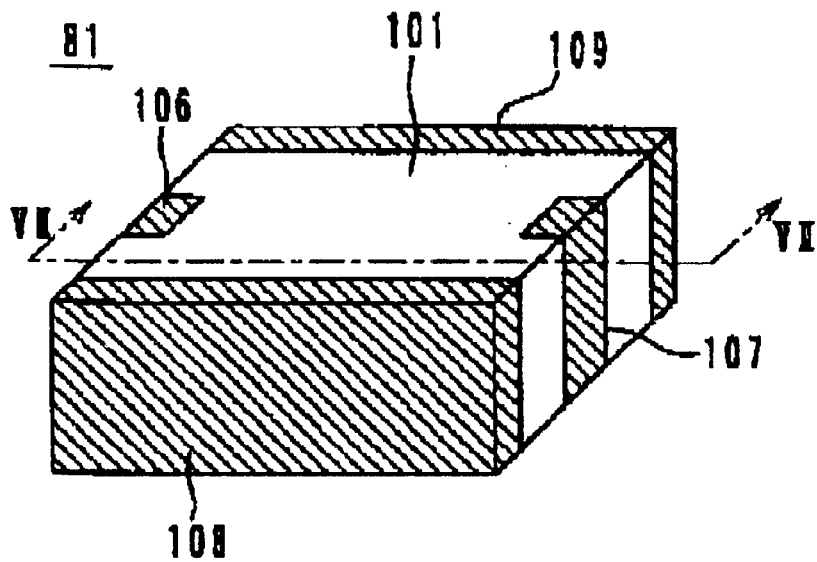
FIG. 6 is an outer perspective view showing the stacked LC filter shown in FIG. 5.

FIG. 5 shows an LC filter 81 according to a second preferred embodiment of the present invention. FIG. 6 is a perspective view showing the configuration of the LC filter 81. The LC filter 81 is a three-stage band-pass filter in which the first stage (the initial stage) LC resonator Q1, the second stage LC resonator Q2, and the third stage (the final stage) LC resonator Q3 are connected in series via coupling capacitors Cs1 and Cs2.

As shown in FIG. 5, the LC filter 81 is defined by ceramic sheets 82 having inductor patterns 83a, 83b, 84a, 85a, and 85b each provided on the surfaces thereof, ceramic sheets 82 having capacitor patterns 89a, 89b, 90a, 90b, 91a, and 91b are provided on the surfaces thereof, ceramic sheets 82 having shielding patterns 92a, and 92b each provided on the surfaces thereof, the ceramic sheets 82 having coupling capacitor patterns 93a, 93b, 94a, and 94b each provided on the surfaces thereof, and a ceramic sheet 82 having a pole adjusting pattern 95 provided on the surface thereof.

The inductor patterns 83a and 83b preferably have substantially identical shapes. A dual-structure inductor L1 includes a stacked arrangement of inductor patterns 83a and 83b on the ceramic sheets 82. Each of the inductor patterns 83a and 83b, disposed on the left portion of the sheets 82, have one edge portion thereof exposed on a front portion of the sheets 82. Other edge portions (wider edge portions) 86a and 86b of the inductor patterns 83a and 83b, respectively, have an increased width. The increased width edge portions 86a and 86b (the other edge portions) function as capacitor patterns. Input-lead patterns 96a and 96b, each extending from the approximately center portion of the inductor patterns 83a and 83b, respectively, are exposed at the left edge portions of ceramic sheets 82.

The inductor patterns 84a and 84b preferably have substantially identical shapes. A dual-structure inductor L2 has a stacked arrangement including the inductor patterns 84a and 84b via ceramic sheets 82. The inductor pattern 84a has a pattern width that is greater by at least approximately ten percent (*10%*) as compared with the pattern widths of inductor patterns 83a, 83b, 85a, and 85b. The inductor patterns 84a and 84b disposed in the approximately central portion of sheets 82 each have an edge portion thereof exposed at the front edge portion of the sheets 82. Other edge portions (wider edge parts) 87a and 87b of the inductor patterns 84a and 84b, respectively, have a greater width than the edge portions at the front edge portion of the sheets 82. The other edge portions 87a and 87b also function as capacitor patterns.

The inductors 85a and 85b preferably have substantially identical shapes. A dual-structure inductor L3 is constructed by stacking the inductor patterns 85a and 85b via ceramic sheets 82. Each of the inductor patterns 85a and 85b disposed in the right-side portion of sheets 82 includes one edge portion thereof exposed at a front edge portion of the sheets 82. Other edge portions 88a and 88b of the inductor patterns 85a and 85b, respectively, have an increased width. The wider edge portions 88a and 88b also function as capacitor patterns. Output-lead patterns 97a and 97b, each extending from the approximately central portions of the inductor patterns 85a and 85b, respectively, are exposed at the right edge portions of the ceramic sheets 82.

The capacitor patterns 89a and 89b are disposed in the left-side portions of the sheets 82 and edge portions thereof are exposed at the rear edge portions of the sheets 82. In the stacking direction of the sheets 82, the dual structure inductor L1 defined by the inductor patterns 83a and 83b is disposed between the capacitor patterns 89a and 89b. These capacitor patterns 89a and 89b face the increased width edge portions 86a and 86b of the inductor patterns 83a and 83b, to define the capacitor C1. The capacitor C1 and the dual-structure inductor L1 define an LC parallel resonant circuit, thereby defining the first stage LC resonator Q1. The capacitor patterns 90a and 90b are disposed in the central portions of the sheets 82 and edge portions thereof are exposed at the rear edge portion of sheets 82. The dual-structure inductor L2 defined by the inductor patterns 84a and 84b is provided between the capacitor patterns 90a and 90b. These capacitor patterns 90a and 90b face the increased width edge parts 87a and 87b of the inductor patterns 84a and 84b, thereby defining the capacitor C2. The capacitor C2 and the dual-structure inductor L2 define an LC parallel resonant circuit, thereby defining the second stage LC resonator Q2.

The capacitor patterns 91a and 91b are disposed in the right-side portions of the sheets 82 and edge portions thereof are exposed at the rear edge portions of sheets 82. The dual-structure inductor L3 defined by the inductor patterns 85a and 85b is provided between the capacitor patterns 91a and 91b. The capacitor patterns 91a and 91b face the increased width edge portions 88a and 88b of the inductor patterns 85a and 85b, thereby defining the capacitor C3. The capacitor C3 and the dual-structure inductor L3 define an LC parallel circuit, thereby defining the third LC resonator Q3.

The coupling capacitor patterns 93a, 93b, 94a, and 94b are provided in the vicinity of the rear edge portion of the sheets 82, and are provided in the stacking direction of the sheets 82 between the inductor patterns 83a, 84a, and 85a, and the inductor patterns 83a, 84a, and 85a. These coupling capacitors 93a and 93b face the inductor patterns 83a, 83b, 84a, and 84b, thereby defining the coupling capacitor Cs1. The coupling capacitor patterns 94a and 94b face the inductor patterns 84a, 84b, 85a, and 85b, thereby defining the coupling capacitor Cs2.

The pole adjusting pattern 95 is provided between the coupling capacitor patterns 93a and 94a, and 93b and 94b. This pole adjusting pattern 95 faces the coupling capacitor patterns 93a, 94a, 93b, and 94b, thereby generating a capacitance. The shielding patterns 92a and 92b each have an edge portion exposed at the front edge portions of the sheets 82, and another edge portion exposed at the rear edge portions of the sheets 82.

By sequentially stacking each sheet 82 having the above construction, as shown in FIG. 5, and uniformly sintering the sheets 82, a layered body 101, as shown in FIG. 6, is produced. The layered body 101 includes an input terminal electrode 106 and an output terminal electrode 107 disposed at the left and right edge portion of the layered body 101, respectively, and shielding terminal electrodes 108 and 109 disposed at the front and rear edge portions of the layered body 101. The input terminal electrode 106 is connected to the input-lead patterns 96a and 96b, and the output terminal electrode 107 is connected to the output-lead patterns 97a and 97b. The shielding terminal electrode 108 is connected to end portions of the inductor patterns 83a to 85b and to edge portions of the shielding patterns 92a and 92b. The shielding terminal electrode 109 is connected to end portions of capacitor patterns 89a to 91b and to the other end portions of the shielding patterns 92a and 92b.

This LC filter 81 achieves the same advantages as the LC filter 31 of first preferred embodiment of the present invention. By changing the area of the overlapping portions between the pole adjusting pattern 95 and the coupling capacitor patterns 93a to 94b, the spacing between poles in the attenuation characteristics of the LC filter 81 can be easily adjusted.

Figure 7:
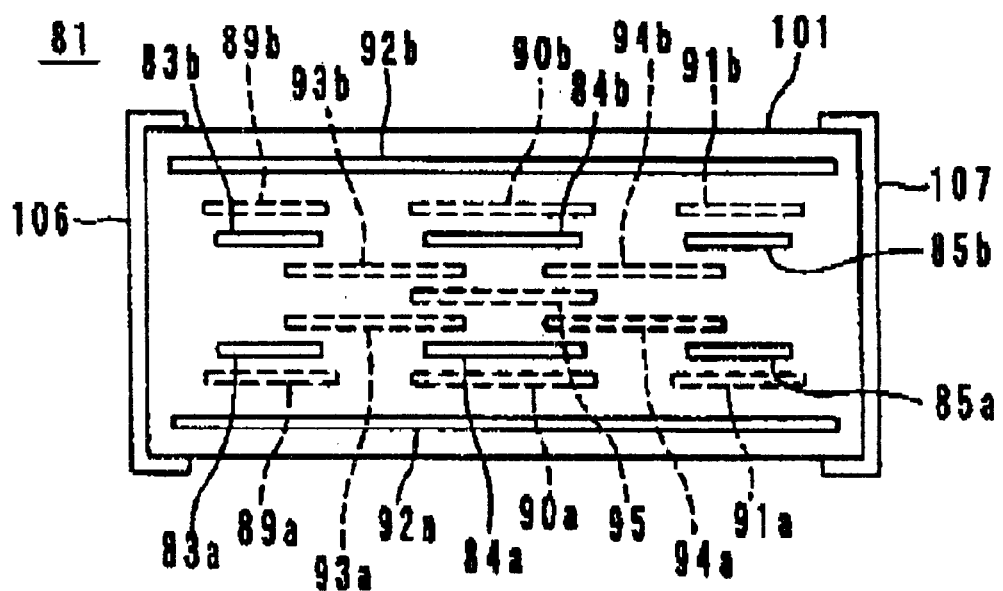
FIG. 7 is a cross-sectional diagram of the LC filter in FIG. 6 through a line VII—VII.

As shown in FIG. 7, in the LC filter 81, magnetic fields H are not present between the inductor patterns 83a and 83b, between the inductor patterns 84a and 84b, and between the inductor patterns 85a and 85b, which define inductors L1 to L3, respectively. Therefore, coupling capacitor patterns 93a to 94b and the pole adjusting pattern 95 provided between inductor patterns 83a, 84a, and 85a, and 83b, 84b, and 85b minimally block magnetic fields generated by the inductors L1 to L3. Accordingly, the LC filter provides uniform magnetic fields H and a greatly increased inductance.

Since the inductors L1 to L3 have dual structures, by adjusting the spacing between the inductor patterns 83a and 83b, the spacing between the inductor patterns 84a and 84b, and the spacing between the inductor patterns 85a and 85b, the distributions of the magnetic fields H occurring at the periphery of each of the inductors L1 to L3 is greatly improved. The LC filter of preferred embodiments of the present invention prevents the magnetic fields H from being concentrated at the edge portions of the inductor patterns 83a to 85b.

The inductor patterns 84a and 84b, which define the second stage LC resonator Q2 disposed at the approximately central portion of the filter 81, have increased pattern widths which are approximately at least ten percent (10%) wider than the inductor patterns 83a, 83b, 85a, and 85b, which define the first and the third stage LC resonators Q1 and Q3 located at both end portions of the filter 81. Therefore, magnetic fields H in the edge portions of the inductor patterns 84a and 84b are further decreased. Therefore, the LC filter 81 achieves a superior Q-factor.

Stacked LC filters according to the present invention are not limited to the above-described preferred embodiments. Various modifications can be made within the spirit and scope of the present invention. For example, the stacked LC filter may include more than three LC resonators.

Furthermore, although in the above-preferred embodiments, stacked LC filters are constructed by stacking ceramic sheets each having patterns disposed thereon then uniformly sintering the stacked ceramic sheets, the present invention is not necessarily limited to this method. The ceramic sheets may be pre-sintered. LC filters may be constructed using a method described below. After a ceramic layer is formed with paste ceramic materials by printing or other suitable methods, an arbitrary pattern is formed by applying a paste conductive pattern materials on the surface of the ceramic layer. Then by applying a paste ceramic materials on the above pattern, the ceramic layers containing the pattern are produced. Likewise, by sequentially repeating the coating process, an LC filter having a layered structure is produced.

The invention may be embodied in other specific forms without departing from the spirit or essential characteristics thereof. The preferred embodiments are therefore to be considered in all respects as illustrative and not restrictive, the scope of the invention being indicated by the appended claims rather than by foregoing description and all changes which come within the meaning and range of equivalency of the claims are therefore intended to be embraced therein.

What is claimed is:

1. A stacked LC filter comprising:
    a layered body including a plurality of insulating layers, a plurality of inductor patterns, and a plurality of capacitor patterns stacked on each other;
    at least three LC resonators disposed in said layered body including a plurality of inductors which are defined by the plurality of inductor patterns, and a plurality of capacitors which are defined by the capacitor patterns and arranged so as to face the inductor patterns;
    at least two coupling capacitor patterns stacked in said layered body and arranged to couple the LC resonators; and
    a pole adjusting pattern stacked in said layered body and arranged to face said at least two coupling capacitor patterns.

2. A stacked LC filter according to claim 1, wherein each inductor of each LC resonator has a multi-layered structure including a stacked arrangement of at least two of said inductor patterns having a substantially identical shape, with the insulating layers provided therebetween.

3. A stacked LC filter according to claim 1, wherein a plurality of capacitor patterns defining an input connection and an output connection are arranged between the inductor patterns of said inductors.

4. A stacked LC filter according to claim 1, wherein each of the plurality of inductor patterns includes increased width portions at one end thereof.

5. A stacked LC filter according to claim 1, wherein the plurality of inductor patterns include increased width portions that define capacitor patterns.

6. A stacked LC filter according to claim 1, wherein the coupling capacitor patterns are arranged opposite to the increased width portions of the inductor portions.

7. A stacked LC filter according to claim 1, further comprising shielding patterns connected to the capacitor patterns.

8. A stacked LC filter according to claim 1, wherein each of said plurality of inductor patterns of said at least three LC resonators extends substantially to a front edge portion of the laminated body.

9. A stacked LC filter according to claim 1, wherein the pattern widths of the inductor patterns of the LC resonators disposed at locations between both end portions thereof are wider than the pattern widths of the inductor patterns of the LC resonators located at both end portions thereof.

10. A stacked LC filter according to claim 1, further comprising an input capacitor capacitively-coupled to one of said at least three LC resonators.

11. A stacked LC filter according to claim 1, further comprising an output capacitor capacitively-coupled to one of said at least three LC resonators.

12. A stacked LC filter comprising:
    a layered body including a plurality of insulating layers, a plurality of inductor patterns, and a plurality of capacitor patterns stacked on each other;
    a plurality of LC resonators disposed in said layered body including a plurality of inductors which are defined by the plurality of inductor patterns, and a plurality of capacitors which are defined by the capacitor patterns and arranged so as to face the inductor patterns;
    at least two coupling capacitor patterns stacked in said layered body and arranged to couple the plurality of LC resonators; and
    a pole adjusting pattern that is stacked in said layered body and faces said at least two coupling capacitor patterns.

13. A stacked LC filter according to claim 12, wherein the plurality of inductor patterns include increased width portions that define capacitor patterns.

14. A stacked LC filter according to claim 13, wherein the at least two coupling capacitor patterns are arranged opposite to the increased width portions of the inductor patterns.

15. A stacked LC filter according to claim 12, wherein each inductor of each LC resonator has a multi-layered structure includes a stacked arrangement of at least two of said inductor patterns having a substantially identical shape, with the insulating layers provided therebetween.

16. A stacked LC filter according to claim 12, wherein a plurality of capacitor patterns defining an input connection and an output connection are arranged between the inductor patterns of said inductors.

17. A stacked LC filter according to claim 12, wherein each of the plurality of inductor patterns includes increased width portions at one end thereof.

18. A stacked LC filter according to claim 12, wherein each of said plurality of inductor patterns of said plurality of LC resonators extends substantially to a front edge portion of the laminated body.

* * * * *